United States Patent [19]

Haug

[11] Patent Number: 5,475,260

[45] Date of Patent: *Dec. 12, 1995

[54] ELECTRONIC READ-ONLY MODULE

[75] Inventor: Werner Haug, Langnau, Switzerland

[73] Assignee: Frama AG, Lauperswil, Switzerland

[*] Notice: The term of this patent shall not extend beyond the expiration date of Pat. No. 5,384,484.

[21] Appl. No.: 316,206

[22] Filed: Sep. 30, 1994

Related U.S. Application Data

[63] Continuation of Ser. No. 21,345, Feb. 22, 1993, Pat. No. 5,384,484.

[30] Foreign Application Priority Data

Mar. 10, 1992 [CH] Switzerland ................. 00757/92

[51] Int. Cl.$^6$ ................. H01L 23/10; H01L 23/32
[52] U.S. Cl. ................. 257/690; 257/698; 257/692; 361/784; 361/785
[58] Field of Search ................. 257/678, 680, 257/681, 690, 692, 702, 704, 698, 700, 723, 724, 727, 731, 732, 733; 361/728, 735, 744, 760, 784, 785, 792; 439/44, 45, 74, 75

[56] References Cited

U.S. PATENT DOCUMENTS

| | | | |
|---|---|---|---|
| 4,514,752 | 4/1985 | Engel et al. | 257/704 |
| 4,752,254 | 6/1988 | Inoue et al. | 361/760 |
| 4,956,694 | 9/1990 | Eide | 257/723 |
| 5,099,396 | 3/1992 | Bart et al. | 361/784 |
| 5,101,322 | 3/1992 | Ghaem et al. | 361/785 |
| 5,198,888 | 3/1993 | Sugano et al. | 257/723 |

FOREIGN PATENT DOCUMENTS

| | | | |
|---|---|---|---|
| 0251651 | 12/1985 | Japan | 257/704 |
| 0024253 | 2/1986 | Japan | 257/723 |

OTHER PUBLICATIONS

IBMTDB, Chang et al., Personalizing Prepackaged Semiconductor Devices, vol. 17, No. 7, Dec. 1974, pp. 1950–1951.
IBMTDB, Doo, Liquid Metal Multihead Connector, vol. 20, No. 11B, Apr. 1978, pp. 4789–4790.

*Primary Examiner*—William Mintel
*Assistant Examiner*—Peter Toby Brown
*Attorney, Agent, or Firm*—Ladas & Perry

[57] ABSTRACT

The electronic read-only memory has an inner and an outer casing. The inner casing is located on a secondary circuit board, from whose edge projecting laterally from the inner casing project contact elements for producing a plug contact with the contact counterelements, which are located on a circuit board of a device, which is to be equipped with the ROM. The outer casing has lateral, outwardly open gaps, which protectively receive the contact elements. Due to the fact that the free end of the contact elements is set back with respect to the opening edge of the cap-like, outer casing, the contact elements are protected against harmful contact. This also greatly simplifies the loading of a device with the ROM, because as a result of a simple plugging movement numerous contact elements can be brought into reliable contact with the contact counterelements.

14 Claims, 3 Drawing Sheets

ELECTRONIC READ-ONLY MODULE

This is a continuation of application Ser. No. 08/021,345, filed Feb. 22, 1993, now U.S. Pat. No. 5,384,484.

BACKGROUND OF THE INVENTION

The invention relates to an electronic read-only memory, with a memory unit (PROM) enclosed in a casing and which has numerous connecting wires for the electrical connection to an electrical circuit board located on the casing base.

For numerous electronic equipments, such as e.g. automatic ticketing machines, franking machines, etc., it is necessary after a certain period of use and for adapting to new circumstances, to replace the electronic read-only memory (ROM). During said replacement it often occurs that as a result of unintentional contact with one of the connecting wires, damage occurs with a falsification of the memory content. Therefore such an interchange requires careful handling by an expert and special tools must be used.

SUMMARY OF THE INVENTION

The problem of the invention is to avoid the aforementioned disadvantage of known read-only memories and to provide a ROM which can be rapidly and simply replaced by a different or new ROM. It must also be robust, so that faults and problems are not caused by careless handling. According to the invention this problem is solved in that the casing base of the memory unit is fixed to a secondary electric circuit board, from whose edge project numerous, projecting contact elements positioned alongside the casing, and that a casing cap is provided, which encompasses the casing of the memory unit, the secondary circuit board and the contact elements. The free end of the contact elements are set back inwardly with respect to the plane of the open end of the casing cap in the interior thereof.

Due to the fact that the projecting contact elements are positioned back into are moved back into the casing cap, they are well protected against unintentional contact.

A number of rod-like contact counterelements are located on the electric circuit board of the apparatus, which is to be loaded with the read-only memory.

Preferably, to the circuit board is fixed an orientation element, e.g. constructed as a short pin and which is intended to be received in a recess in the casing cap edge.

For further securing the contact elements against inadmissible contact, in the casing cap is inserted an inner closure wall which in the vicinity of the contact elements has a spacing from the casing cap edge, so that a gap is defined in which the contact elements are located.

DESCRIPTION OF THE DRAWINGS

The invention is described in greater detail hereinafter relative to a nonlimiting embodiment show in the attached drawings. The figures show the following.

DETAILED DESCRIPTION OF THE PREFERRED EMBODIMENT

Figure 1:
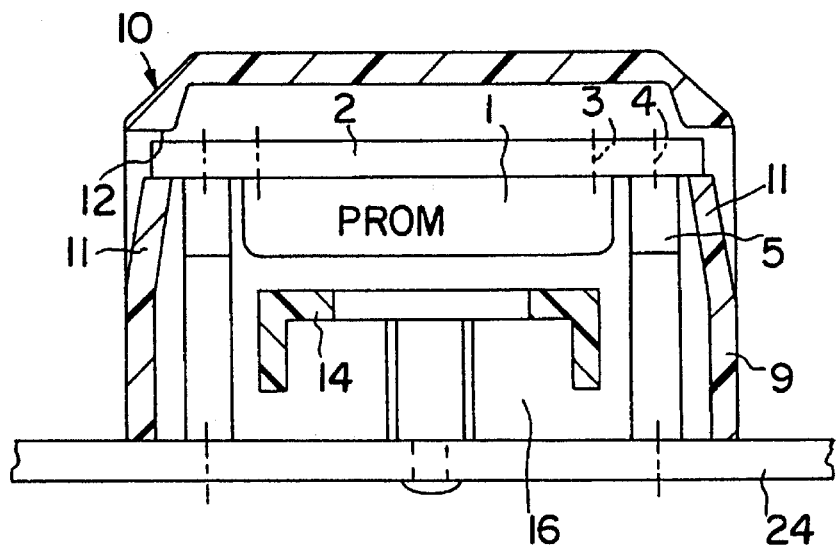
FIG. 1 A central cross-section through a read-only memory module according to the invention in the fitted position.
Figure 2:
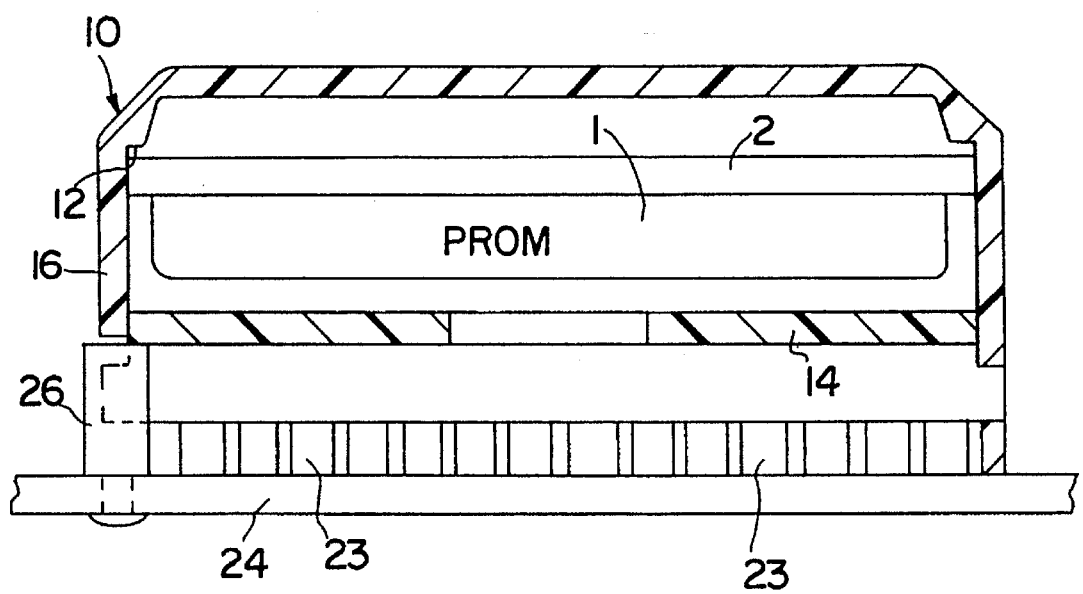
FIG. 2 A central longitudinal section through the ROM module of FIG. 1.
Figure 3:
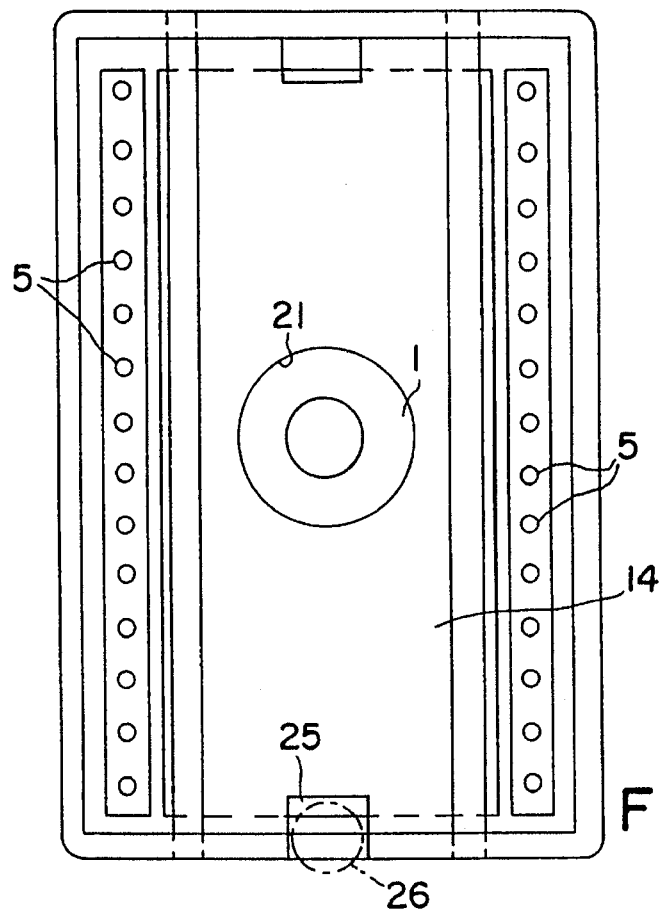
FIG. 3 A view against the open side of an uninstalled ROM module.
Figure 4:
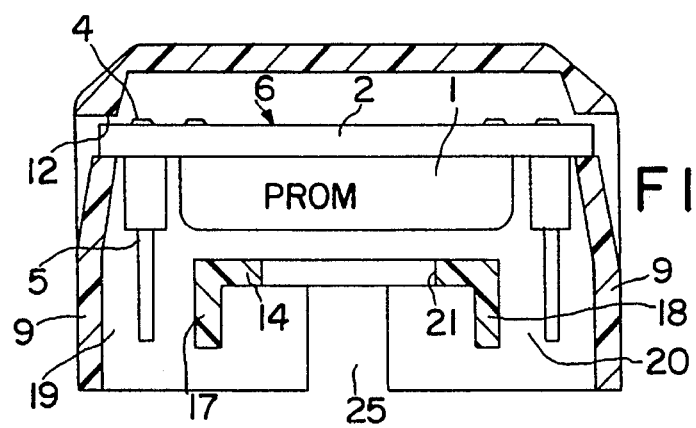
FIG. 4 A central cross-section through the ROM module of FIG. 3.
Figure 5:
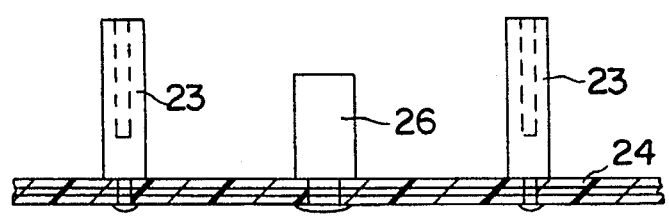
FIG. 5 A cross-section through the circuit board of an electrical device for loading with the ROM module.

As shown in FIGS. 1 to 4, the casing 1 of the memory unit (PROM, EPROM, etc.) is fixed to the underside of a secondary circuit board 2. Its electrical connecting wires 3 in each case extend through the secondary circuit board 2 and are soldered at their tops to the stepped, thin end 4 of a contact element e.g. in tile form of contact pins 5 projecting downwards from said board 2.

Figure 7:
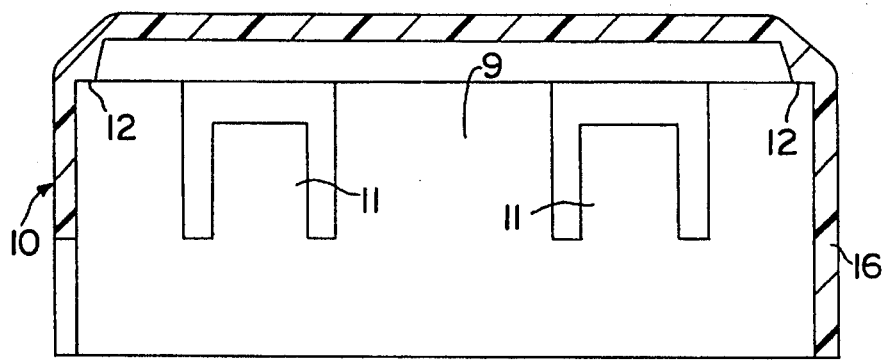
FIG. 7 A longitudinal section through the casing cap of FIG. 6.
Figure 6:
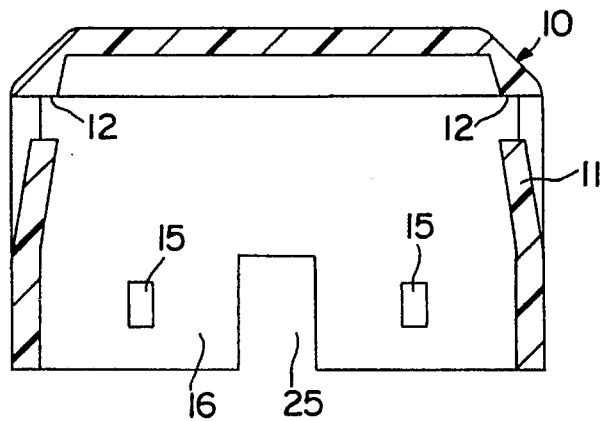
FIG. 6 A cross-section through the ROM module casing cap.
Figure 8:
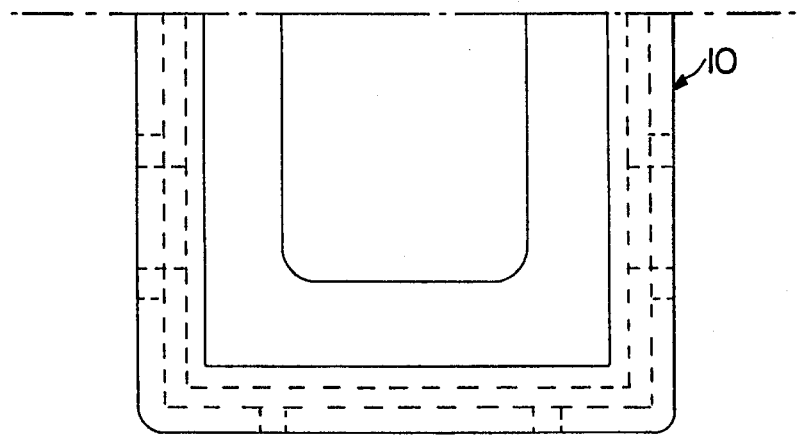
FIG. 8 A plan view of half the casing cap.

The inner device 6 of the ROM module comprising the memory unit with its casing 1, the secondary circuit board 2 and the contact pins 5, is locked in a casing cap 10 encompassing the same and which is separately shown in FIGS. 6 to 8. For a locked assembly of the inner device 6 there are inwardly sloping spring tongues 11 in the two facing, longer walls 9 of the casing cap 10, and these tongues 11 are moved outwardly upon insertion of the secondary circuit board 2, and then spring back on pressing in the secondary circuit board 2 into casing cap 10 until the secondary circuit board 2 is past the end of tongues 11 and engages the bottom surface of the inner steps 12.

The casing cap 10 is locked by an inner closure wall 14 which has four lateral extensions which engage in correspondingly shaped small openings 15 located in the shorter walls 16 of the casing cap 10. The longer, downwardly bent edges 17,18 of the closure wall 14 have a spacing with respect to the longer walls 9 of the casing cap 10, so that two gaps 19, 20 are formed, which enclose the contact pins 5 and protect them against contact. The free end of the edges 17, 18 of the closure wall 14 are set back inwardly with respect to the opening edge of the casing cap 2, so as to facilitate the mounting of the ROM module on the corresponding area of the primary circuit board 24 to be loaded and the plug connection between the contact elements 5, 23, i.e. pins 5 and bushings 23. The free ends of the contact pins 5 are also set back with respect to edges 17, 18 of the closure wall 14, so that a good contact protection is ensured.

In the center of the closure wall 14 there is an access opening 21, which for programming purposes allows access to the memory unit enclosed in the casing 1.

So as to ensure that it is impossible to carry out a side-inverted insertion of the numerous contact pins 5 into the associated, projecting contact bushings 23 of the circuit board 24 of an apparatus loaded with the ROM module, in one of the shorter walls 16 of the casing cap 10 is provided a recess 25, and at a corresponding position on the circuit board 24 there is an orientation element in the form of a pin 26, which is received by the recess 25 on reaching the correct plug-in position for obtaining engagement between the contact elements 5, 23, i.e. pins 5 and bushings 23.

What is claimed is:

1. An electronic read-only memory module electrically connectable to a primary electrical circuit board, said module comprising:

a casing having a base;

a memory unit enclosed in said casing and having a plurality of connecting leads extending to the exterior of said casing and from said base;

a secondary electrical circuit board having a side positioned adjacent said casing base;

a plurality of secondary contact elements projecting perpendicularly from said side of said secondary circuit board, said plurality of secondary contact elements having free ends connectable with mating primary contact elements on the primary circuit board, said plurality of secondary contact elements being electrically connected to corresponding ones of said connecting leads of said memory unit;

a casing cap having an open end, a closed end, and walls encompassing and fixedly holding said secondary circuit board, said casing, and said secondary contact elements, such that said free ends of said secondary contact elements are set back inwardly with respect to a plane containing the open end of said casing cap, and such that said secondary contact elements project toward the open end of said casing cap; and a closure wall contained within and attached to said casing cap, said closure wall being located between said casing and the open end of said casing cap, such that a gap is provided laterally between said closure wall and said casing cap for clear passage of said secondary contact elements.

2. The memory module as claimed in claim 1, wherein said casing cap has a recess which opens toward the open end for receiving an orientation element projecting from the primary circuit board.

3. The memory module as claimed in claim 1, wherein said casing cap has resilient tongues with ends projecting internally of said casing cap, whereby said secondary circuit board is held locked behind the ends of said resilient tongues.

4. The memory module as claimed in claim 3, wherein said casing cap has a recess which opens toward the open end for receiving an orientation element projecting from the primary circuit board.

5. The memory module as claimed in claim 1, wherein said closure wall has an opening to provide access to said memory unit.

6. The memory module as claimed in claim 5, wherein said casing cap has a recess which opens toward the open end for receiving an orientation element projecting from the primary circuit board.

7. The memory module as claimed in claim 5, wherein said casing cap has resilient tongues with ends projecting internally of said casing cap, whereby said secondary circuit board is held locked behind the ends of said resilient tongues.

8. The memory module as claimed in claim 7, wherein said casing cap has a recess which opens toward the open end for receiving an orientation element projecting from the primary circuit board.

9. An electronic read-only memory module electrically connectable to a primary electrical circuit board, said module comprising:

a casing having a base;

a memory unit enclosed in said casing and having a plurality of connecting leads extending to the exterior of said casing and from said base;

a secondary electrical circuit board, said casing base being positioned adjacent said secondary circuit board;

a plurality of secondary contact elements projecting from said secondary circuit board and having free ends connectable with mating primary contact elements on the primary circuit board, said plurality of secondary contact elements being electrically connected to corresponding ones of said connecting leads of said memory unit;

a casing cap having an open end and walls encompassing and fixedly holding said secondary circuit board, said casing, and said secondary contact elements, such that said free ends of said secondary contact elements are set back inwardly with respect to a plane containing said casing cap open end; wherein said casing cap has resilient tongues with ends projecting internally of said casing cap, whereby said secondary circuit board is held locked behind the ends of said resilient tongues; and a closure wall contained within and attached to said casing cap, such that said casing is located between said casing cap and said closure wall, and such that a gap is provided laterally and between said casing cap and said closure wall for clear passage of said secondary contact elements; wherein said closure wall comprises depending side edges to define a U-shaped cross section for said closure wall, said gap being defined by said casing cap and said side edges of said closure wall.

10. The memory module as claimed in claim 9, wherein said closure wall has an opening to provide access to said memory unit.

11. The memory module as claimed in claim 9, wherein:

said depending side edges of said closure wall have free edges which are set back inwardly with respect to the plane containing the casing cap open end; and said free ends of said secondary contact elements are set back inwardly of said free edges of said closure wall side edges.

12. The memory module as claimed in claim 10, wherein:

said depending side edges of said closure wall have free edges which are set back inwardly with respect to the plane containing the casing cap open end; and said free ends of said secondary contact elements are set back inwardly of said free edges of said closure wall side edges.

13. An electronic read-only memory module electrically connectable to a primary electrical circuit board, said module comprising:

a casing having a base;

a memory unit enclosed in said casing and having a plurality of connecting leads extending to the exterior of said casing and from said base;

a secondary electrical circuit board, said casing base being positioned adjacent said secondary circuit board;

a plurality of secondary contact elements projecting from said secondary circuit board and having free ends connectable with mating primary contact elements on the primary circuit board, said plurality of secondary contact elements being electrically connected to corresponding ones of said connecting leads of said memory unit;

a casing cap having an open end and walls encompassing and fixedly holding said secondary circuit board, said casing, and said secondary contact elements, such that said free ends of said secondary contact elements are set back inwardly with respect to a plane containing said casing cap open end; and a closure wall contained within and attached to said casing cap, such that said casing is located between said casing cap and said closure wall, and such that a gap is provided laterally and between said casing cap and said closure wall for clear passage of said secondary contact elements; wherein said closure wall comprises depending side edges to define a U-shaped cross section for said closure wall, said gap being defined by said casing cap and said side edges of said closure wall; wherein said closure wall has an opening to provide access to said memory unit.

14. The memory module as claimed in claim 13, wherein:

said depending side edges of said closure wall have free edges which are set back inwardly with respect to the plane containing the casing cap open end; and said free ends of said secondary contact elements are set back inwardly of said free edges of said closure wall side edges.

\* \* \* \* \*